United States Patent [19]
Robinson

[11] Patent Number: 4,667,180
[45] Date of Patent: May 19, 1987

[54] CONTINUOUS TIME DOMAIN ANALOG-DIGITAL CONVERTER

[75] Inventor: Jeffrey I. Robinson, New Fairfield, Conn.

[73] Assignee: General DataComm, Inc., Middlebury, Conn.

[21] Appl. No.: 822,396

[22] Filed: Jan. 27, 1986

[51] Int. Cl.$^4$ .............................................. H03M 1/44
[52] U.S. Cl. ...................... 340/347 AD; 340/347 CC; 340/347 M; 307/261; 307/262; 323/315; 323/316
[58] Field of Search .................. 340/347 AD, 347 M; 307/261, 262; 363/127; 323/315, 316

[56] References Cited

U.S. PATENT DOCUMENTS 3,579,231  5/1971  Bylanski ...................... 340/347 AD
4,045,793  8/1977  Moench ....................... 340/347 DA

OTHER PUBLICATIONS

Rife, High Accuracy with Standard ICs: An Elegant ADC's Forte: EDN, Apr. 28, 1982, pp. 137-144.
Signetics Corporation, Applications for the NE531, Linear LSI Data and Applications Manual 1985, pp. 9-204.
The Engineering Staff of Analog Devices, Inc., Analog-Digital Conversion Handbook, 6/1972, pp. III-1 to III-9.
Dewitt et al, Transistor Electronics, McGraw-Hill Book Company, Inc., 1957, pp.22-203.

Primary Examiner—T. J. Sloyan
Attorney, Agent, or Firm—David P. Gordon

[57] ABSTRACT

A continuous time domain parallel analog to digital converter is provided for accomplishing the general successive rectification algorithm $I_{out}=2|I_{in}|-I_{ref}$. One stage of the continuous parallel converter comprises a complimentary transistor pair and three current mirrors. The transistor pair and a first current mirror and a second current mirror act as a rectifier. The complimentary transistor pair has $I_{in}$ connected to common sources, and common gates connected to ground. A first current mirror has its input connected to the drain of the n-type transistor of the complimentary pair and its output connected to the drain of the p-type transistor. The second current mirror acts as an amplifier by having its input transistors being half the width of the corresponding output transistors. The second mirror has its input connected to the output of the first current mirror, and its output going to $I_{out}$. The third current mirror acts to subtract $I_{ref}$ from the rectified amplified $V_{in}$, and has $V_{ref}$ as an input and an output connected to $I_{out}$. The $I_{out}$ of one stage acts as the $I_{in}$ to a second stage, and the stages are cascaded. The direction of flow of $I_{in}$ to each stage provides bits of information. Where a voltage signal is to be converted into digital form, the signal is transformed into a current signal $I_{in}$ through the use a transconductance amplifier prior to digital conversion by the provided continuous parallel A/D converter.

11 Claims, 8 Drawing Figures

CONTINUOUS TIME DOMAIN ANALOG-DIGITAL CONVERTER

BACKGROUND

The present invention relates to an apparatus for converting analog signals to digital signals. The invention more particularly relates to circuitry for converting analog signals to digital signals in both discrete and continuous time domains.

Many different types of analog to digital converters are known in the art. Perhaps the most common analog to digital converters are the successive approximation converters, the flash converters, and the dual slope converters. Each have their advantages and disadvantages. For example, the successive approximation converters typically permit accurate conversion to at least twelve bits, but are only of medium speed and in certain embodiments require digital to analog converters having $2^n$ capacitors, where n is the number of bits in the output word. The flash converters are much faster than the successive approximation converters, but require $2^{n-1}$ comparators, thus making them costly in terms of components. Moreover, flash converters currently available have an accuracy of at most nine bits of resolution. Finally, while permitting finer resolution and fewer components, the dual slope converters are considered much too slow for most applications.

Another analog to digital converter called a recirculating-cyclic converter or serial successive rectification converter is known in the art. It uses a cyclic, or stage-by-stage conversion algorithm originally employed in high-speed, low-resolution applications, and is described in an article by Doug Rife entitled "High Accuracy with Standard ICs: An Elegant ADC's Forte", *EDN*, Apr. 28, 1982 pp. 137-144. Basically, according to the article, the input signal is compared to a midpoint (ground) to see which half of the permitted range it is in. A first bit of information is determined thereby. The input is then rectified, multiplied by two, and a reference voltage is subtracted therefrom through the use of an operational amplifier and resistor network. The voltage output $V_{out}$, which is equal to $2|V_{in}| - V_{ref}$ is then recirculated to the input end where a second bit is determined by the comparator and the signal is again rectified, multiplied by two, and decreased by the reference voltage. The output is again recirculated, and in this manner, as many bits of resolution as desired may be obtained without increasing the component count. The cycle and resolution are controlled by the sampling timing. The Gray code output of the comparator of the circuit is converted into binary code through the use of an exclusive NOR gate.

The advantage of the serial successive rectification analog to digital converter is the reduction in the number of components required for conversion. Indeed, with recirculation, additional bits of resolution may be obtained without increasing the numbers of components used. However, the serial successive rectification converter is still only of medium speed, as each additional bit of resolution requires an additional cycle of processing.

SUMMARY OF THE INVENTION

It is therefore an object of the invention to provide a successive rectification converter in a parallel format which permits a fast high resolution analog to digital conversion.

It is a further object of the invention to provide a continuous parallel successive rectification converter using current steering techniques for extremely fast high resolution analog to digital conversion.

It is yet another object of the invention to provide an extremely fast high resolution analog to digital converter which is exclusively comprised of transistors.

In accord with the objects of the invention, two embodiments of a parallel successive rectification converter are provided. In the first embodiment, the synchronous parallel successive rectification converter comprises:

(a) a plurality of stages for performing the conversion algorithm $V_{out} = 2|V_{in}| - V_{ref}$, wherein $V_{in}$ is the voltage to the input of a particular stage, $V_{out}$ is the voltage at the output of that stage and becomes the $V_{in}$ to the following stage, and $V_{ref}$ is a chosen reference voltage, each stage comprising (i) a comparator means for comparing $V_{in}$ with a second reference voltage for obtaining a bit of information, (ii) a first input sampling capacitor, (iii) a second feedback capacitor, wherein the capacitance of said first input sampling capacitor is twice that of said feedback capacitor.

(iv) a third switch capacitor, (v) a switching network for permitting the charging and discharging of said input sampling capacitor, said feedback capacitor, and said switch capacitor according to predetermined clocking, (vi) an operational amplifier having said input sampling capacitor bridging its inverting and noninverting inputs via said switching network, and said feedback capacitor feeding back from the operational amplifier output to its inverting input, wherein said switching network is arranged to switch the connections of the plates of said sampling capacitor to said operational amplifier inputs as a function of said clocking and said obtained bit of information to effectuate rectification of $V_{in}$, and wherein said switching network is arranged to switch the connection of said switch capacitor as a function of said clocking from being connected to the output of said operational amplifier to being between the source of said chosen reference voltage and said inverting input of said operational amplifier, and (b) a plurality of shift registers, each shift register corresponding to a particular stage and having a storage capacity of m bits of information, where m is chosen from $\emptyset$ to $n-1$ and is the number of said particular stage with $n-1$ representing the most significant bit and $\emptyset$ representing the least significant bit, wherein n is the number of bits output by said analog to digital converter, wherein the output of said shift registers provides an output word in Gray code.

In one embodiment, means for converting said Gray code output word into a binary code output word are included. Typically such means comprises exclusive OR or NOR gates.

In accord with a further aspect of the invention, the continuous time parallel successive rectification converter for converting an analog signal into digital form comprises:

(a) a plurality of stages for performing the conversion algorithm $I_{out} = 2|I_{in}| - I_{ref}$, wherein $I_{in}$ is the current to the input of a particular stage, $I_{out}$ is the current at the output of that stage which becomes the $I_{in}$ to the next stage, and $I_{ref}$ is a chosen reference current, each stage comprising (i) a current rectifier comprising a-p-channel transistor and an n-channel transistor having common gates connected to ground and common sources connected to $I_{in}$, a first current mirror with its input connected to the drain of said n-channel transistor of said, and its output connected to at least the drain of said p-channel transistor, and a second current mirror with the drain of said p-channel transistor as an input and said $I_{out}$ as an output, (ii) a third current mirror with said $I_{ref}$ as an input and said $I_{out}$ as an output, wherein said second current mirror of said current rectifier has a gain of two, the analog signal converted by said apparatus is related to the $I_{in}$ current into the first stage of said apparatus, and a bit of information is obtained from the direction of the current flow of each $I_{in}$, the output bit of each stage together forming a Gray code output word.

Preferably, the second current mirror obtains a gain of two by arranging the transistors on the output side of said current mirror to be twice the width of the corresponding transistors of the input side of said current mirror. Also, if desired, means for converting said Gray code output word into a binary code output word are provided. Typically such means comprises exclusive OR or NOR gates. It should also be recognized that the analog signal which is to be converted into digital format is "related" to the $I_{in}$ to the first stage of the converter in that the analog signal may be $I_{in}$ itself, or a voltage signal analagous thereto.

Since an analog voltage is typically supplied rather than a current, the second embodiment of the invention typically requires the use of transconductance amplifiers to provide an $I_{in}$ and $I_{ref}$. According to a further aspect of the invention, a transconductance amplifier of the invention having a voltage input and a current output, comprises:

(a) a resistance means in series with the voltage input;

(b) first and second double output current mirrors, wherein each output of the first double output mirror is connected to a corresponding output of said second double output mirror, and the inputs are connected;

(c) an operational amplifier with the inverting input connected to ground, the noninverting input connected to said resistance means, and the op amp output connected to the inputs of said first and second double output mirrors, wherein first outputs of said first and second double output mirrors outputs are connected to said noninverting input of said operational amplifier, and the second outputs of said first and second double output mirrors output is connected to said $I_{out}$.

A better understanding of the invention, and additional advantages and objects of the invention will become apparent to those skilled in the art upon reference to the detailed description and the accompanying drawings.

BRIEF DESCRIPTION OF THE DRAWINGS

FIG. 2 is an illustration of the Gray code decision thresholds resulting from the successive rectification converter of FIG. 1a;

FIG. 5a is a part block diagram part schematic of the parallel continuous successive rectification converter of the invention and the circuitry of one stage of the continuous converter;

FIG. 5b is a diagram defining the direction and polarity of current flow for the continuous converter of FIG. 5a;

FIG. 6 is a schematic of the transconductance amplifier used in converting voltages to currents for use with the continuous analog-digital converter of FIG. 5a.

DETAILED DESCRIPTION OF THE PREFERRED EMBODIMENTS

Figure 1A:
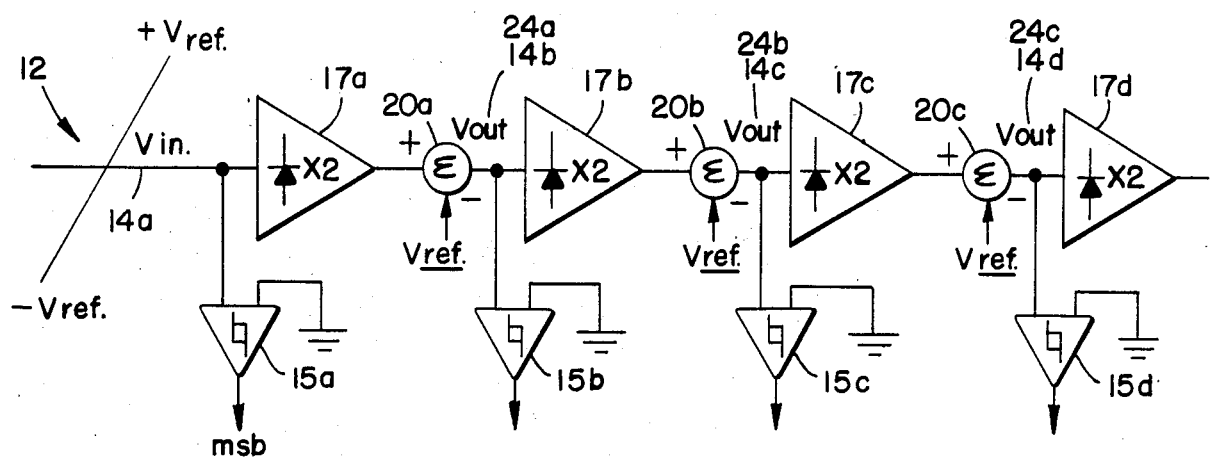
FIGS. 1a and 1b are respectively a block diagram of the successive rectification algorithm of the prior art, and a schematic of the waveforms resulting therefrom.

Turning to FIG. 1a, a block diagram of the successive rectification converter algorithm of the art is shown. As seen at 12, a sampled analog signal $V_{in}$ 14a having a voltage between $-V_{ref}$ and $V_{ref}$ is compared to another reference voltage (ground) by comparator 15a. A first bit of information as to whether the sampled voltage is positive or negative is obtained thereby. The input voltage is then rectified and amplified by a factor of two at rectifier-amplifier 17a, and $V_{ref}$ is subtracted from the resulting voltage at summing junction 20a to obtain $V_{out}$ 24a. $V_{out}$ 24a may be considered to be the input voltage 14b to the second stage of the analog-digital converter. The process may then be repeated, with a second bit of information being obtained by comparing the new $V_{in}$ 14b to ground at comparator 15b. The new input voltage 14b is then rectified and amplified by a factor of two at rectifier-amplifier 17b, and $V_{ref}$ is subtracted from the resulting voltage at adding junction 20b to obtain $V_{out}$ 24b. The same process may be repeated as many times as desired in multiple identical stages to obtain as many bits of resolution as is required. Alternatively, the $V_{out}$ of the first stage may be recirculated back as a new input to the first stage provided proper clocking and switching are utilized.

Figure 1B:
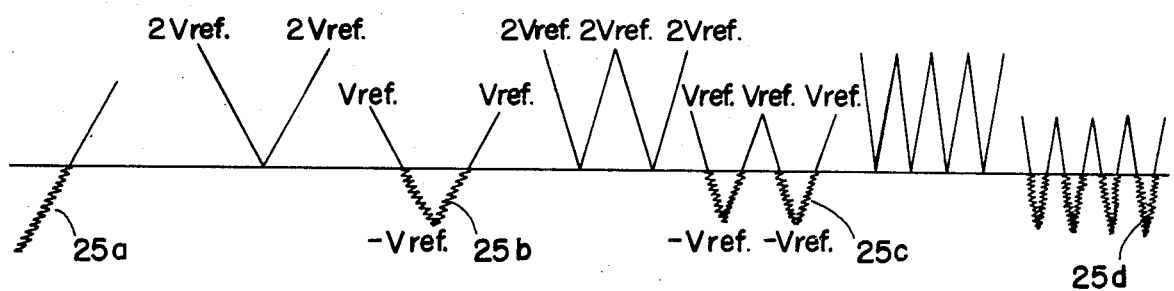
Figure 2:
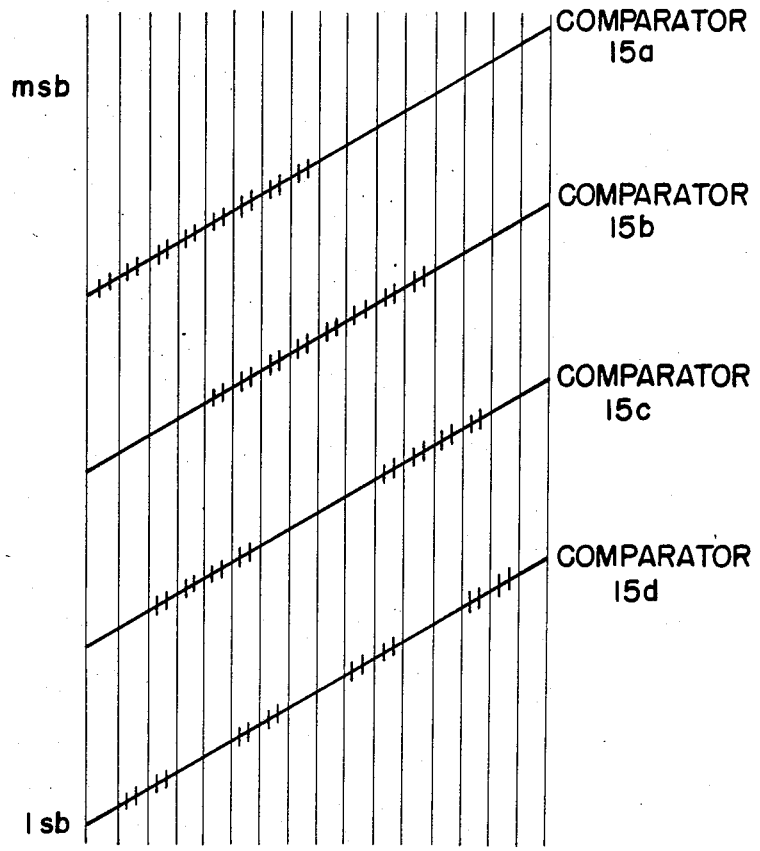

Those skilled in the art will appreciate that the amplification of the signal accomplished by the successive rectification converter avoids the problems of the successive approximation converters and flash converters of the art where signal amplitudes are attenuated and descent to the millivolt or microvolt region depending on the amount of resolution desired. Indeed, the effect of the rectification, amplification and subtraction is to fold the input signal about zero volts as seen at 25a in FIG. 1b. The repeated folding of the input signal at 25a, 25b, . . . divides the input signal into $2^n$ segments, where n is the number of bits of resolution desired, and n−1 is the amount of stages required. Any input may then be represented in a Gray code according to the region in which it falls. For example, as seen in FIG. 2 a decision threshold chart may be arranged where the shaded region for each comparator signifies a negative value while the unshaded region designates a positive value. The shading for each comparator may respectively be taken from signals 25a, 25b, . . . of FIG. 1b. With four bits of resolution, an input voltage may be said to lie in one of sixteen unique segments. Each segment may then be represented by reading the threshold chart and assigning a zero to shaded regions and a one to unshaded regions. It will be recognized that a Gray code output results, with the lowest input coded as 0111, the next input coded as 0110, etc. The most positive value would be coded as 1111.

The Gray code output of FIG. 2 can be effectively converted into a binary output if required. One method of converting the code would be to use a look-up chart (e.g. a ROM). Another approach requires that a word of code be read from the most significant bit to the least significant bit. If the inspected bit is a one, then the next bit remains unchanged. If the inspected bit is a zero, then the next bit is inverted. Thus, it will be seen that the lowest input, which was coded as 0111 in the Gray code, will be converted to 0000. The first "1" is inverted by the zero in front of it, leaving 0011. The resulting zero of the second bit then inverts the third bit's "1" into a zero, which in turn inverts the last bit, leaving 0000. Likewise, the second lowest value will become 0001, as the two "1's" will be inverted into zeroes, and the zero in the lsb will be inverted into a "1". Those skilled in the art will appreciate that such an operation may be realised by taking the exclusive NOR of the current bit and its predecessor to form the new current bit.

Figure 3:
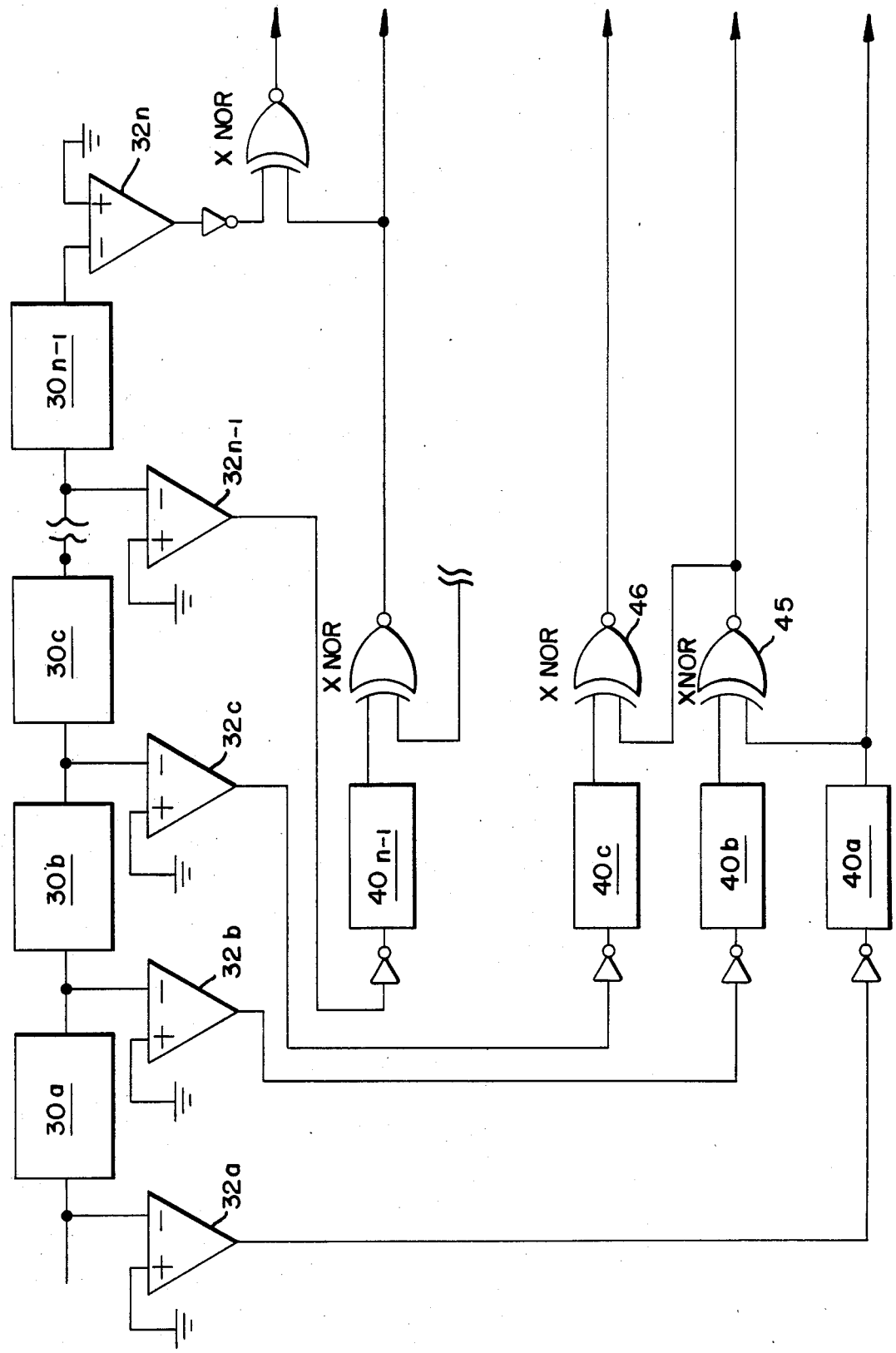
FIG. 3 is a block diagram of the parallel synchronous successive rectification converter of the invention.
Figure 4:
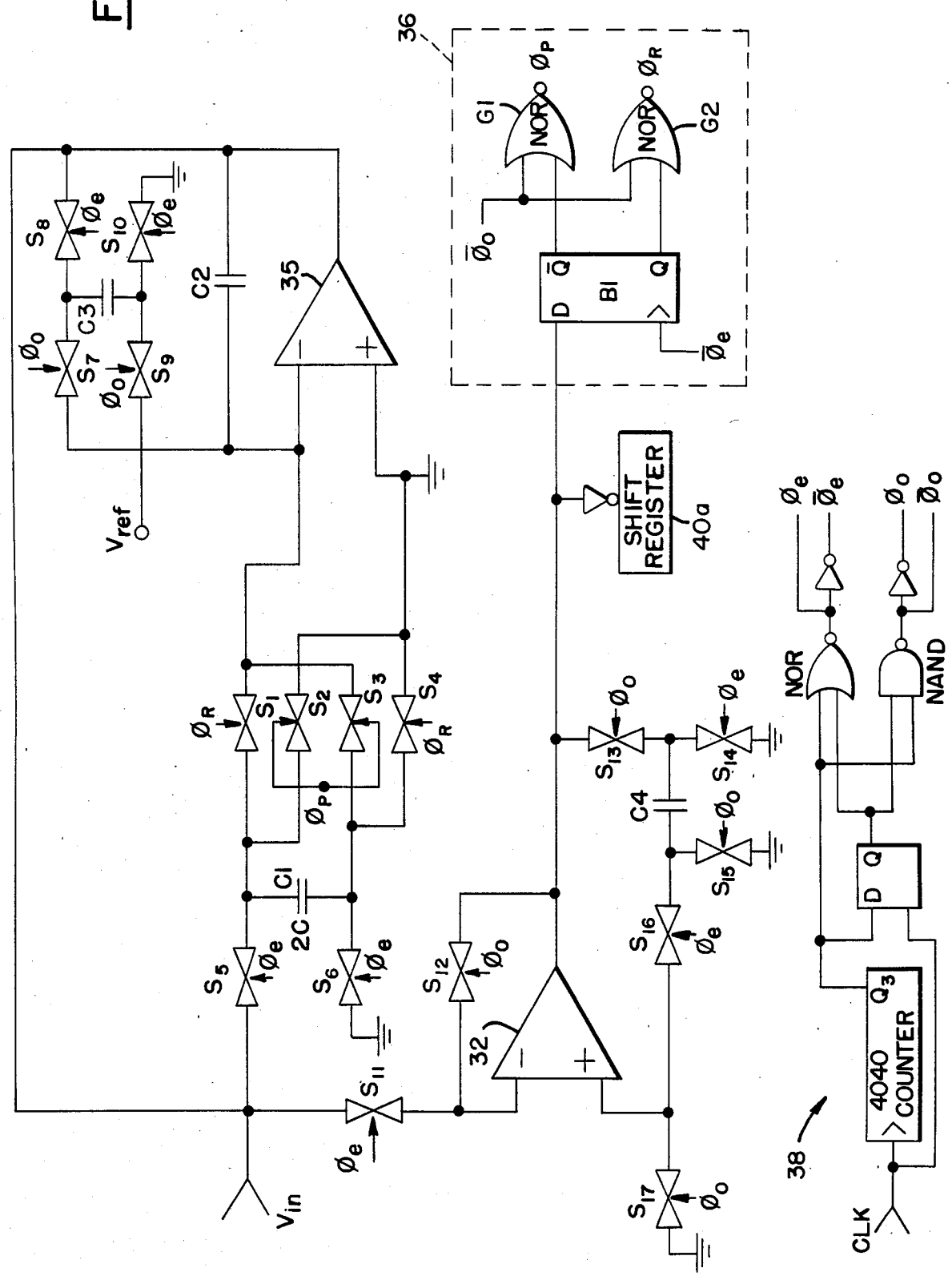
FIG. 4 is a schematic of the circuitry of one stage of the parallel synchonous successive rectification converter of FIG. 3, and the logic associated therewith.

An implementation of the successive rectification converter algorithm in a parallel synchronous form according to the invention is seen in block diagram form in FIG. 3. One stage 30a for performing the conversion algorithm $V_{out} = 2|V_{in}| - V_{ref}$, is shown in FIG. 4 and comprises a comparator 32, op amp 35, an input sampling capacitor C1, a feedback capacitor C2, a switch capacitor C3, switches S1 through S10, logic circuitry 36, and clock generator 38. As will be described in more detail below, a first bit of information is obtained by comparing the voltage $V_{in}$ to ground. Then, when switches S5 and S6 are opened, input sampling capacitor C1 is charged up to $V_{in}$. When the charge of C1 is released by C1 through a rectifier comprised of switches S1 through S4, the feedback capacitor C2 is charged to twice the absolute value of $V_{in}$, because the capacitance of C1 is arranged to be twice that of C2. Simultaneously, capacitor C3 is connected to the inverting op amp side of capacitor C2 and because capacitor C3 sees a voltage $V_{ref}$, the voltage over C2 is decreased by the value of $V_{ref}$ when C2 has has a capacitance equal to C3. In this manner, a $V_{out}$ equal to $2|V_{in}| - V_{ref}$ is provided. The voltage output of the first stage 30a becomes the voltage input into stage 30b where identical circuitry performs the identical function. The logic for controlling the switches of stage 30a is seen as gates G1 and G2, flip-flop B1 and clock circuitry 38. Those skilled in the art will recognize that only one clock generator is required to control as many algorithm performing stages 30a, 30b, 30c . . . as are being utilized. However, each stage requires the equivalent of gates G1 and G2 and flip-flop B1.

According to the parallel synchronous embodiment, the information bit outputs of the comparators 32 of each stage are inverted (as the inputs were originally sent to the inverting input) and sent to shift registers 40a, 40b . . . , as seen in FIG. 3. The storage capacity of shift register 40a is preferably arranged to be m bits of information, where m equals n−1 for the most significant bit and 0 for the least significant bit, and where n is the number of bits of resolution being utilized, and n−1 is the number of stages utilized. Thus, it will be understood that no shift register is required for the information determined by a last comparator located at the output of the last stage, as the shift register would have zero storage capacity.

In operation, a sample of an analog voltage signal having voltage $V_{in}$ is provided to the negative input of comparator 32 and compared to ground. Switches S11–S17 and capacitor C4 are provided in conjunction with comparator 32 to eliminate offset problems and to take the criticality out of the design of the comparator 32. A first bit of information is obtained from comparator 32 and sent to shift register 40a and to logic circuitry 36, and in particular to the D input of flip-flop B1. When non-overlapping clock generator 38, which is comprised of a clock input, a negatively edge triggered binary counter 42, a positively edge triggered flip-flop B2, NOR gate G3, NAND gate G4 and invertors G5 and G6, provides an even phase, switches S5 and S6 are closed and capacitor C1 is charged up to a voltage of $V_{in}$ as switches S1–S4 are all open.

On the negative edge of the even phase, the not even phase input into B1 goes high, causing whatever information is at D to be transferred to not Q. If $V_{in}$ is greater than ground, the output from comparator 32 is low as is the not Q output of B1. Conversely, the Q output of B1 goes high causing NOR gate G2 to be low, thereby leaving switches S1 and S4 open. Meanwhile, with the not Q output of B1 being low, when the odd phase starts (clock generator 38 is non-overlapping), the not odd phase goes low, causing NOR gate G1 high and resulting in the closing of switches S2 and S3. If $V_{in}$ was negative, G1 would go low and G2 would go high, thereby causing switches S1 and S4 to close and switches S2 and S3 to open. Those skilled in the art will appreciate that this combination of switches and logic acts to rectify the $V_{in}$ signal by switching the connection of the plates of capacitor C1 to the op amp 35, and thereby causing a $-V_{in}$ voltage to appear at the inverting input of op amp 35.

As stated above, when switches S1 and S4 or S2 and S3 close, the voltage $-V_{in}$ is seen at the inverting input of op amp 35. In response, the op amp immediately causes its output voltage to swing high, thereby pulling a current. In this manner, the charge stored on C1 is transferred to capacitor C2, ultimately leaving the potential across C1 at zero and thereby bringing the inverting input of op amp 35 to ground. When the voltage at the inverting input of op amp 35 reaches ground, the system is in equilibrium. Because C1 is arranged to have a capacitance twice that of C2, in equilibrium, the voltage at the output of op amp 35 and across C2 becomes twice that of the former voltage across C1 (i.e. $2|V_{in}|$). Thus, the arrangement of providing an operational amplifier with an input sampling capacitor C1 bridging (via switching network S1–S4) its inverting and noninverting inputs, and a feedback capacitor C2 feeding back from the operational amplifier output to its inverting input, permits the rectified $V_{in}$ signal to be amplified by a factor of two at the output of op amp 35.

When the odd phase is high, not only does the charge on capacitor C1 get transferred to C2, but switches S7 and S9 close causing the final aspect of the successive rectification algorithm to be performed simultaneously. When switch S9 is closed, the voltage $V_{ref}$ appears at one plate of capacitor C3 thereby causing the other to charge to $V_{ref}$. In response to the non-zero voltage ($V_{ref}$) appearing at its inverting input, the voltage output of op amp 35 swings low causing current to flow until an equilibrium is reached. In essence, when the capacitance of C2 and C3 are equal, the equilibrium due to $V_{ref}$ is reached when the voltage at the output of op amp 35 and across C2 is decreased by $V_{ref}$. The decrease of voltage across capacitor C2 causes the inverting input of operational amplifier 35 to ground. Thus, the voltage at the output of op amp 35 becomes $2|V_{in}| - V_{ref}$. This output voltage is then fed into stage 30b as the input voltage of that stage, where it is tested by a comparator to see whether it is a positive or negative voltage. As aforedescribed, the determination of the comparator provides another bit of information which is sent to shift register 40b. The voltage input is then processed by identical circuitry and fed successively into additional identical stages. In order to provide n bits of resolution, the analog signal $V_{in}$ must be processed my n−1 stages, and a comparator 40n must be located at the output of the last stage.

Those skilled in the art will appreciate that the arrangement of C2 and C3 and switches S7–S10 also provide a voltage canceling function to permit the performance of the algorithm. Thus, after C2 and C3 have been charged to $V_{out}$ and $V_{ref}$ respectively, and a new cycle starts, C3 is charged to $V_{out}$ during the even phase because switches S8 and S10 are closed. Since $V_{out}$ refers to the voltage of the previous cycle, it may also be designated as $V_{old}$. When the new odd phase starts, C2 is actually charged to $2|V_{in}| + V_{old} - (V_{ref} + V_{old})$. It will be appreciated that the old voltages across the capacitors cancel out to provide the desired result.

Those skilled in the art will also understand that according to the best mode, the switches S1–S17, gates G1 and G2, and flip-flop B1 of each successive stage are triggered by opposite phases. Thus, in stage 30b, switches S5 and S6 are preferably closed during the odd phase when a $V_{out}$ is being determined and provided by stage 30a, thus permitting the sampling capacitor C1 of stage 30b to charge to the $V_{out}$ voltage of stage 30a. Likewise, gates G1 and G2 which control switches S1–S4 would be triggered by the start of the even phase (not even phase going low). Also switches S7 and S9 would close during the even phase, while switches S8 and S10 would close during the odd phase.

As aforedescribed, the shift registers 40 associated with the various stages 30, have a storage capacity of m bits of information with m ranging from n−1 to ∅. Thus, the shift register 40a associated with stage 30a, which is actually located before the processing circuitry, has a storage capacity of n−1 (or seven) bits, while the shift register 40b associated with stage 30b has a storage capacity of n−2 (six) bits of information. In an eight bit converter, the sixth stage would have a shift register storage capacity of two bits of information, and the last stage (m=1) would have a shift register with a single bit capacity. The output of the seventh stage would then be fed to a comparator without a concomitant stage and without a shift register. This last comparator would provide the least significant bit of information.

It should be appreciated that each stage 30 will take an identical length of time to provide a voltage output equal to twice the absolute value of the input voltage minus the reference voltage. Thus, while the second stage 30b is processing the input voltage provided by the first stage to provide an output voltage, the first stage 30a will be processing a second sample of the analog input. Indeed, those skilled in the art will recognize that if stage 30a, which (before processing) provides the most significant bit of information (the "t=∅ bit") is said to provide the same at time t=∅, the second stage, 30b will compare the output of stage 30a and provide a second bit of information at time t=1. The last stage processes the t=∅ sample and sends it to a comparator at time t=7, at which time the first stage is sampling and providing its eighth bit of information. Because shift register 40a has a storage capacity of only seven bits, the t=∅ sample bit of information is output by shift register 40a at the identical time (t=7) that the last stage outputs its "t=∅ bit" of information. Likewise, all of the intermediate shift registers 40b, 40c . . . simultaneously output their t=∅ bit of information. Thus, an eight-bit digital Gray code word representing a sample of an analog signal is provided by the shift registers 40a, 40b . . . for each time period. In other words, after seven time periods, the invention permits the production of an eight bit word of information approximately eight times as fast as the recirculating or serial successive rectification converters of the prior art. Of course, sixteen bit words could be produced sixteen times as fast. It should be understood that it is not intended that the invention be limited to eight bit and sixteen bit situations, but rather that the invention encompasses parallel synchronous successive rectification regardless of word length.

Those skilled in the art will appreciate that the Gray code words output by the parallel synchronous successive rectification embodiment of the invention may be converted to binary code according to the techniques discussed with regard to FIGS. 1 and 2 herein. Preferably the conversion is accomplished through the use of exclusive NOR gates as seen in FIG. 3. Thus, the bit output by shift register 40a (the "msb") is taken intact, and is also used as an input into exclusive NOR gate 45. The other input into gate 45 is the bit output by shift register 40b. If the msb is a zero, the bit output by shift register 40b is inverted by gate 45. If the msb is a one, the bit output by shift register 40b remains intact. Regardless, the output of gate 45 provides the second bit of the binary word and an input into exclusive NOR gate 46. Again, the output of the previous shift register (in this case 40b) determines whether the bit being output by shift register 40c is to be inverted or not, and the output of gate 46 is used as the third bit of the binary word and an input into yet another exclusive NOR gate. Those skilled in the art will appreciate that n−1 exclusive NOR gates are used to convert the Gray code output of the invention into a binary output word of n bits.

Figures 5A, 5B:
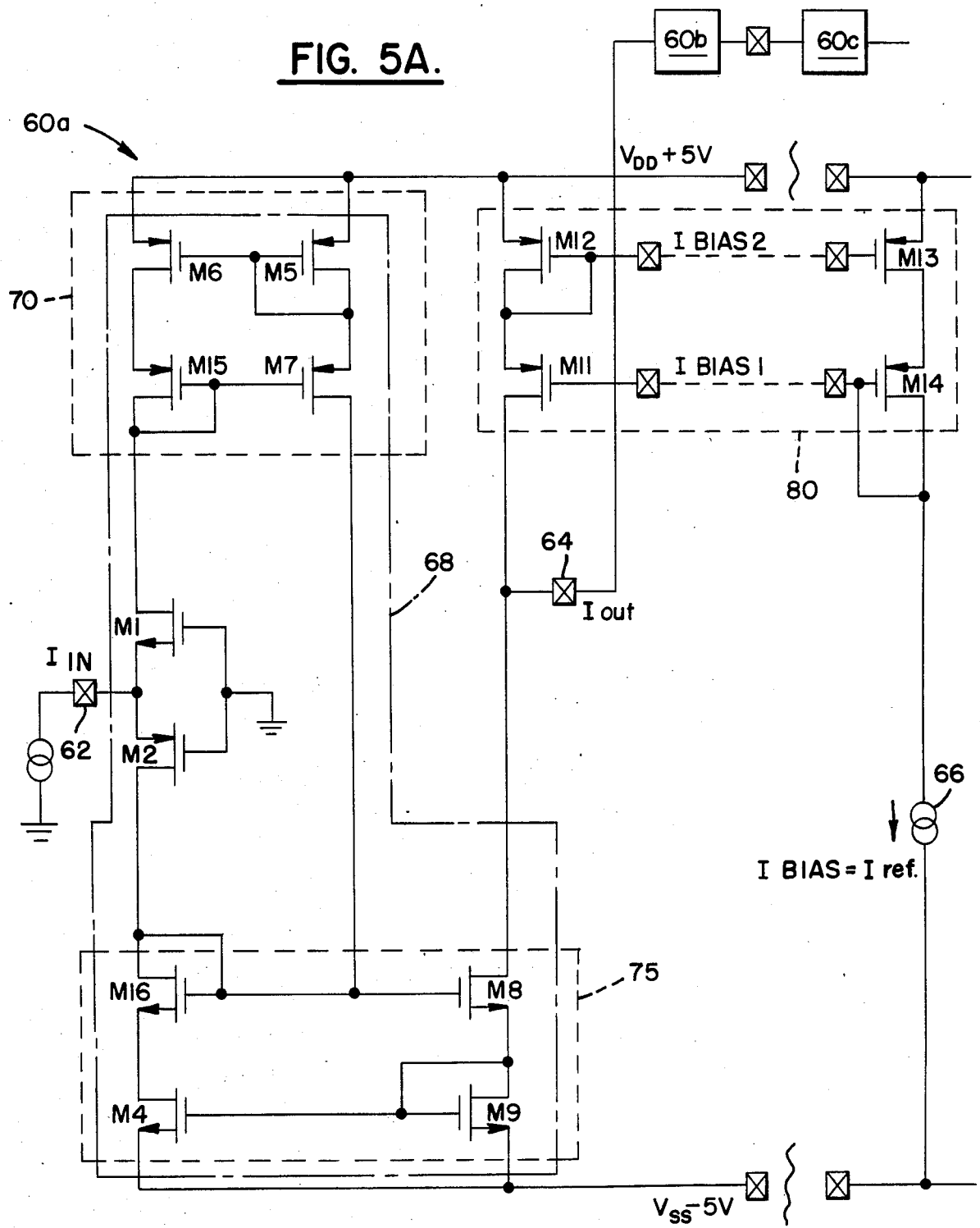

Turning to FIG. 5a, the continuous time embodiment of the successive rectification A-D converter is shown implemented with MOSFETs. FIG. 5a should be understood with reference to FIG. 5b which defines the direction and polarity of current flow. Thus, a current flow out of the input will be considered to be a positive current (providing a negative voltage), while a current flow into the output will also be considered a positive current.

As seen in FIG. 5a, the continuous time embodiment requires an input current $I_{in}$ and a reference current $I_{ref}$, and transconductance amplifiers for converting input and reference voltages into currents are typically utilized. A particular transconductance amplifier for accomplishing the same will be described more fully hereinafter.

As with the parallel synchronous time embodiment, the continuous time embodiment implements the successive rectification algorithm of the art, except that voltages are changed into currents. Thus, a plurality of stages 60a, 60b, . . . for performing the conversion algorithm $I_{out} = 2|I_{in}| - I_{ref}$ are provided wherein $I_{in}$ 62 is the current at the input of a particular stage, $I_{out}$ 64 is the current at the output of that stage which becomes the $I_{in}$ of the next stage, and $I_{ref}$ 66 is chosen reference current.

In order to provide a rectified input current, a current rectifier 68 is provided and essentially comprises: a complementary transistor pair having an n-channel FET M1 and a p-channel FET M2 with common gates connected to ground, and common sources connected to the source of $I_{in}$ 62; a first current mirror 70 having p-channel FETs M6, M15, M5 and M7, with the input connected to the drain of said p-channel FET M1, and the output connected to at least the drain of said n-channel FET M2; and a second FET current mirror 75 having n-channel FETs M16, M4, M8, and M9, with the drain of p-channel FET M2 as the input, and current flowing from $I_{out}$ 64 as the output. Those skilled in the art will appreciate that this arrangement provides an offset-free current rectifier.

The amplification of the $I_{in}$ current by a factor of two is accomplished in the second FET current mirror 75 by having the widths of the mirror FETs M8 and M9 being twice the widths of their corresponding FETs M16 and M4.

A third FET current mirror 80 comprising p-channel FETs M11, M12, M13, and M14 is used to complete the algorithm by subtracting the $I_{ref}$ current 66 from $I_{out}$ 64. Thus, $I_{ref}$ 66 (which may be derived by processing $V_{ref}$ with a transconductance ampifier) serves as the current mirror input and is connected to the drain of FET M14. In turn a mirror current is provided at the drain of FET M11, and that output is connected to $I_{out}$ 64. With the current rectifier, amplifier, and subtractor so arranged, the input current is processed and leaves stage 60a according to the algorithm $I_{out} = 2|I_{in}| - I_{ref}$. As with the parallel synchronous embodiment of the invention, the output of one stage becomes the input to the successive stage.

In operation, a first bit of information is derived from the direction of the flow of current $I_{in}$ 62. If current is flowing out (positive flow) of the circuitry toward the current source (transconductance amplifier), the provided voltage may be assumed to be negative as the gate of M1 is at ground. Current flowing into stage 60a (negative flow) may be considered evidence of a positive voltage. With the sources of FETs M6, M5, and M12 at a positive supply potential, and the sources of FETs M4 and M9 at a negative supply potential, if the current is flowing negatively at stage 60a, it must necessarily follow a path through FETs M2, M16, and M4, as FET M1 will not allow current to flow through it in that direction. As a result of that flow, FETs M8 and M9, which complete the second current mirror 75, provide a twin current which mirrors FETs M16 and M4. However, because FETs M8 and M9 are arranged to have twice the widths of FETs M16 and M4, the current flowing through FETs M8 and M9 is twice that of the current $I_{in}$ flowing through FETs M16 and M4.

If the current is flowing positively (out of) at stage 60a, the current must necessarily be coming from FETs M6, M15, and M1, as FET M2 will not permit current to flow through it in such a direction. As a result of the current flowing through FETs M6 and M15, an equal current flows through FETs M5 and M7, as FETs M5 and M7 complete the first current mirror 70. Current leaving the drain of FET M7 continues through the drain of FET M16 because of the gate-drain short of FET M16 and then continues through FET M4. The flow of current through FETs M16 and M4 cause a flow through FETs M8 and M9 of twice the $I_{in}$ current, as previously described, because FETs M8 and M9 complete second current mirror 75 and because FETs M8 and M9 are twice the width of FETs M16 and M4. Thus, it is seen that the combination of the complimentary transistor pair M1 and M2 with first current mirror 70, and second current mirror 75, acts to rectify the current signal, as the current magnitude dictated by $I_{in}$ will always flow in the same direction through FETs M8 and M9. Because the current is "supplied" by $I_{out}$, the current due to $2|V_{in}|$ will always flow positively from the input of stage 60b, and will always be positively rectified. It is also seen that the input current signal may be amplified by a factor of two by causing the transistors on the mirror side of the second current mirror 75 to be twice the width of the corresponding transistors on the input side.

The operation of the final aspect of the successive rectification algorithm is seen by referring to $I_{ref}$ 66 and third current mirror 80. By choosing $I_{ref}$ to be a current in a defined direction, the $I_{ref}$ current is forced to flow down through FETs M13 and M14. The current flow through FETs M13 and M14 causes an identical current to flow through FETs M12 and M11, the mirror FETs of current mirror 80. Thus, current $I_{ref}$, by definition, flows negatively at $I_{out}$, in the opposite direction of the current $(2|I_{in}|)$ flowing through FETs M8 and M9, and completes the operation. As the $I_{out}$ of stage 60a is the $I_{in}$ of stage 60b, a second bit of information may be determined by determining the direction of the flow of current at the input to stage 60b. Indeed, as aforementioned, if the current is flowing out of stage 60b (positive flow), the voltage will be measured as a negative voltage as the gate of the M1 FET of stage 60b is at ground. Conversely, current flowing into stage 60b will be provide a positive voltage measurement.

As with the parallel synchronous embodiment of the invention, the output of the stages provides information in a Gray code. Again, if desired, the Gray code may be converted into binary information by processing it through exclusive NOR gates. Indeed, it should be understood that because the algorithm utilized remains constant, the resulting Gray codes of the invention embodiments are identical.

Those skilled in the art will appreciate that the continuous parallel successive rectification A-D converter is extremely fast in providing as many bits of resolution as is required because it uses current steering techniques rather than capacitors. Indeed, it is therefore aptly described as a continous converter as no switches are required for timing. It is also extremely energy efficient as the FETs of the embodiment use very little power. Thus, a continuous time parallel successive rectification A-D converter modelled according to the teachings of the invention was able to provide six bits of resolution in 290 nanoseconds, and twelve bits of resolution in 580 nanoseconds. The wattage per stage was approximately 0.5 milliwatts. However, the transconductance amplifiers used to convert the reference and sampled voltages into currents utilized 192 milliwatts. It should be recognized that such an overall performance permits the realization of the invention in microchips and integrated circuits, and permits the employment of the invention in a wide range of devices.

Figure 6:
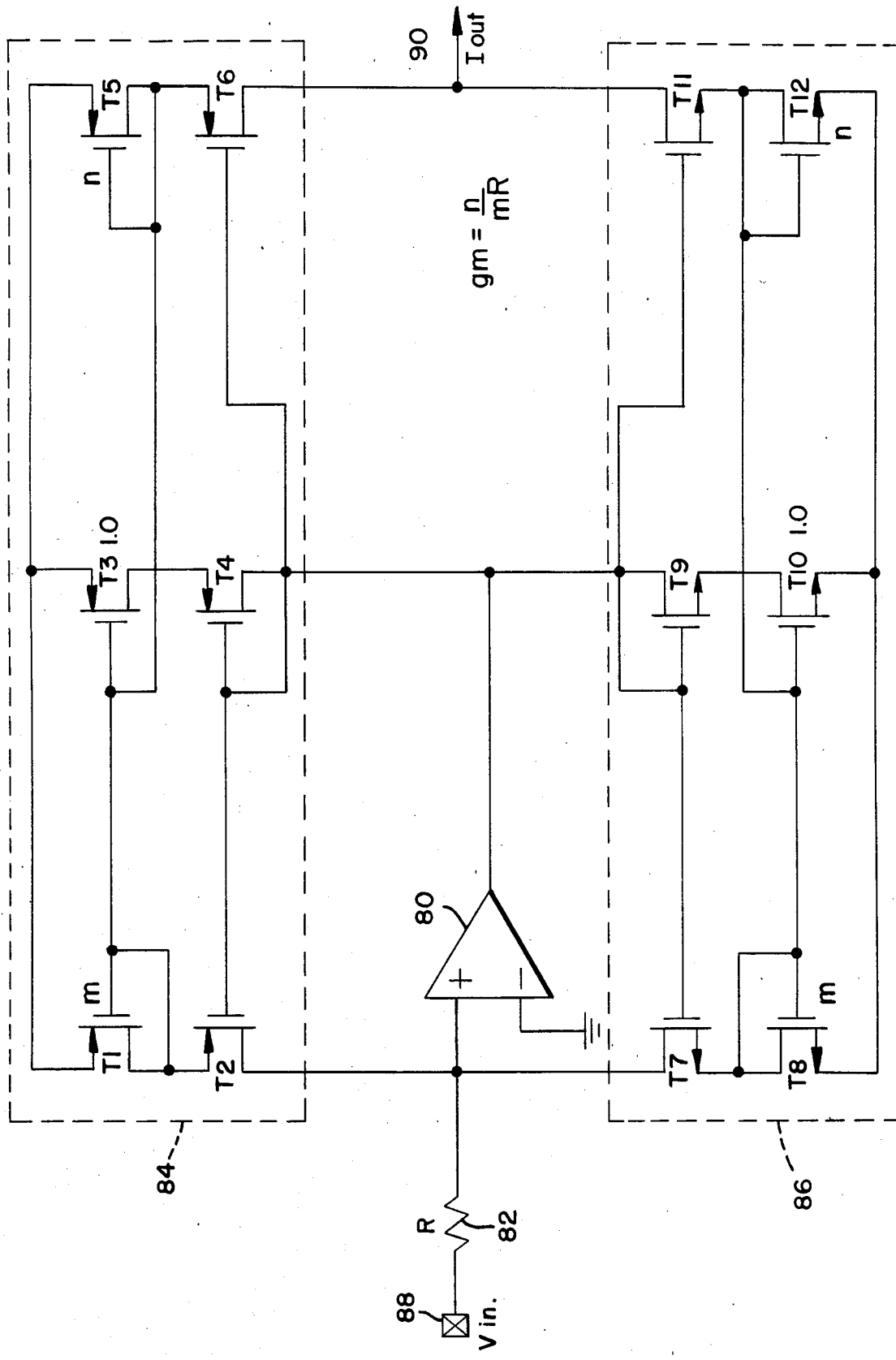

Turning to FIG. 6, the preferred transconductance amplifier used with the continuous time successive rectification A-D converter invention is seen and generally comprises an op amp 80, a resistor 82, and two double output current mirrors 84 and 86. The resistor 82 is connected in series between the voltage input $V_{in}$ 88 and the noninverting input of the operational amplifier 80. The inverting input of the op amp 80 is connected to ground. The output of the op amp 80 is connected to and acts as the input of the double output current mirrors 84 and 86. A first double output current mirror comprises p-channel FETs T1, T2, T3, T4, T5, and T6, with FETs T1, T3, and T5 having connected or common gates and connected or common sources, and FETs T2, T4, and T6 having connected or common gates. FETs T1, T4 and T5 are shorted with their gates being connected to their drains. The drains of FETs T1, T3, an T5 are respectively connected to the sources of FETs T2, T4, and T6. The sources of FETs T2 and T6 (the outputs) are respectively connected to the noninverting input of op amp 80 and a node from which $I_{out}$ 90 is taken, with their source of FET T4 (the input) connected to the output of omp amp 80.

Second double output current mirror 86 comprises n-channel FETs T7, T8, T9, T10, T11, and T12. FETs T8, T10, and T12 have connected or common sources and gates, with FETs T8 and T12 being shorted by having their gates conected to their drains. The drains of FETs T8, T10, and T12 are respectively connected to the sources of FETs T7, T9, and T11 which have common or connected gates. FET T9 is shorted with its gate being connected to its drain. The drains of FETs T7, T9, and T11 are respectively connected to the drains of FETs T2, T4, and T6.

In operation, the input voltage 88 causes a current to flow through resistance means 82, and also causes a voltage to appear at the noninverting input to amplifier 80. For purposes of example, if the input voltage was of positive polarity, the response of the op amp 80 would be to increase the output voltage of the op amp 80. A higher voltage at the ouput would cause an increased current flow in FETs T9 and T10, and a decreased flow in FETs T3 and T4 if a constant voltage difference is maintained between the sources of FETs T1, T3, and T5, and the sources of FETs T8, T10, and T12. Because FET T9 is the input into the double output current mirror 86, the current flow through FETs T9 and T10 will cause twin flows to occur both in FETs T7 and T8, and T11 and T12. The exact ratio of the flow will depend on the relative channel widths of FETs T10, T8 and T12. As shown in FIG. 6, the ratio of current flow in FETs T8, T10, and T12 will be m:l:n. Likewise, because FET T4 is the input to double output current mirror 84, the current flow through FETs T3 and T4 will cause twin flows to occur both in FETs T1 and T2, and T5 and T6. Because the ratio of the widths of T1, T3, and T5 is arranged to correspond to the ratio of the widths of T8, T10, and T12, the ratio of the current flow through FETs T1, T3, and T5 is m:l:n.

Those skilled in the art will understand that the resulting current $I_{out}$ 90 from the transconductance amplifier as described will be the difference of the current flowing into FETs T6 and T11. The total current $I_{out}$ according to the invention is equal to $V_{in}(n/mR)$, where the transconductance $g_m$ is defined as n/mR.

There has been described and illustrated herein apparatus for converting analog signals into digital signals, and an apparatus for converting a voltage into a corresponding current. While particular embodiments of the invention have been described, it is not intended that the invention be limited thereby, as it is intended that the invention be broad in scope and that the specifications be read likewise. For example, while the continuous parallel successive rectification converter was described as using current mirrors each having four transistors, different current mirrors using two, three, or other amounts of transistors could be effectively used. Likewise, while particular logic circuitry was supplied for the parallel synchronous converter embodiment, different logic providing similar results could be easily constructed. Further, while a particular transconductance amplifier was described for use with the continuous converter embodiment, other transconductance amplifiers known in the art may also be used.

It should also be recognized that the converters and amplifier of the invention may be realized in many different forms. For example, discrete components may be used for each of the described devices. Or, if desired, the components may be partially or fully integrated into an integrated circuit. Finally, if desired, equivalent componentry may be substituted with only minor resulting changes in the designs and results. Thus, for example, the MOSFETs used and described could be replaced by bipolar transistors and resistors, if desired, and it is intended that the invention encompass such minor changes. Indeed, it is intended that the terminology relating to the transistors be used in a broad sense, with "source" being generic for a source of emitter, "gage" being generic for a gate or base, etc. Therefore, it will be apparent to those skilled in the art that other changes and modifications may be made to the invention as described in the specification without departing from the spirit and scope of the invention as claimed.

I claim:
1. An apparatus for the analog to digital conversion of a signal, comprising:
   a plurality of stages for performing the conversion algorithm $I_{out}=2|I_{in}|-I_{ref}$, wherein $I_{in}$ is the current at the input of a particular stage, $I_{out}$ is the current at the output of that stage which becomes the $I_{in}$ to the next stage, and $I_{ref}$ is a chosen reference current, each stage having
   (i) a current rectifier comprising
   (1) a p-channel transistor and an n-channel transistor having common gates connected to ground and common sources connected to $I_{in}$,
   (2) a first current mirror with its input connected to the drain of said n-channel transistor and its output connected to at least the drain of said p-channel transistor,
   (3) a second current mirror with the drain of said p-channel transistor as an input and said $I_{out}$ as an output,
   (ii) a third current mirror with said $I_{ref}$ as an input and said $I_{out}$ as an output,
   wherein said second current mirror of said current rectifier has a gain of two,
   said analog signal converted by said apparatus is related to the $I_{in}$ current into the first stage of said apparatus, and wherein
   a bit of information is obtained from the direction of the current flow of each $I_{in}$, the bit obtained from each stage together forming a Gray code output word.
2. An apparatus according to claim 1, further comprising:
   a first transconductance amplifier,
   wherein said analog signal converted by said apparatus is a voltage signal Vin, and said first transcon- ductance amplifier takes said input voltage signal and provides said current signal $I_{in}$ into said first stage of said apparatus.

3. An apparatus according to claim 2, wherein said reference current is derived from a reference voltage, further comprising:
a second transconductance amplifier for taking said reference voltage and providing said reference current signal $I_{ref}$.

4. An apparatus according to claim 1, wherein:
a least significant bit of information is obtained from the direction of the current flow at the output of the last stage of said apparatus, wherein the bit obtained from each stage and the bit obtained from the output of the last stage together form a Gray code output word.

5. An apparatus according to claim 4 wherein:
said second current mirror has at least one transistor on its input side and at least one transistor on its output side, and the transistors on the output side of said current mirror are twice the width of the corresponding transistors on the input side of said current mirror.

6. An apparatus according to claim 5, further comprising:
a first transconductance amplifier,
wherein said analog signal converted by said apparatus is a voltage signal $V_{in}$, and said first transconductance amplifier takes said input voltage signal and provides said current signal $I_{in}$ into said first stage of said apparatus.

7. An apparatus according to claim 6, wherein said reference current is derived from a reference voltage, further comprising:
a second transconductance amplifier for taking said reference voltage and providing said reference current signal $I_{ref}$.

8. An apparatus according to claim 4, further comprising: means for converting said Gray code output word into a binary output word.

9. An apparatus according to claim 8, wherein:
said means for converting said Gray code output comprise a plurality of exclusive NOR gates.

10. An apparatus according to claim 4, further comprising:
a first transconductance amplifier,
wherein said analog signal converted by said apparatus is a voltage signal $V_{in}$, and said first transconductance amplifier takes said input voltage signal and provides said current signal $I_{in}$ into said first stage of said apparatus.

11. An apparatus according to claim 10, wherein said reference current is derived from a reference voltage, further comprising:
a second transconductance amplifier for taking said reference voltage and providing said reference current signal $I_{ref}$.

* * * * *